United States Patent
Zhan

[11] Patent Number: 6,047,765
[45] Date of Patent: *Apr. 11, 2000

[54] CROSS FLOW COOLING DEVICE FOR SEMICONDUCTOR COMPONENTS

[76] Inventor: Xiao Zhan, 629 S. Rancho Santa Fe Rd. #426, San Marcos, Calif. 92069

[ * ] Notice: This patent issued on a continued prosecution application filed under 37 CFR 1.53(d), and is subject to the twenty year patent term provisions of 35 U.S.C. 154(a)(2).

[21] Appl. No.: 08/699,913

[22] Filed: Aug. 20, 1996

[51] Int. Cl.⁷ .................................................... H05K 7/20
[52] U.S. Cl. .................. 165/80.3; 165/121; 165/185; 174/16.3; 257/719; 361/697; 361/704; 415/53.1; 415/119
[58] Field of Search .................. 165/80.3, 121, 165/185; 174/16.3; 257/722, 718, 719; 361/695, 697, 703, 704; 415/53.1, 119, 175, 178

[56] References Cited

U.S. PATENT DOCUMENTS

| | | |
|---|---|---|
| D. 356,777 | 3/1995 | Katsui et al. . |
| 3,238,725 | 3/1966 | Ludin ...................................... 415/53.1 |
| 3,263,749 | 8/1966 | Dormitzer ................................ 165/122 |
| 3,477,635 | 11/1969 | Glucksman ............................. 415/53.1 |
| 3,664,349 | 5/1972 | Quick .................................. 415/53.1 X |
| 4,462,750 | 7/1984 | Sugawara et al. ..................... 415/53.3 |
| 4,514,140 | 4/1985 | Knopf ..................................... 415/119 |
| 4,958,504 | 9/1990 | Ichikawa et al. ..................... 165/122 X |
| 5,077,601 | 12/1991 | Hatada et al. ...................... 165/80.3 X |
| 5,281,106 | 1/1994 | Reinhardt et al. .................. 415/119 X |
| 5,287,249 | 2/1994 | Chen et al. . |
| 5,288,203 | 2/1994 | Thomas . |
| 5,309,983 | 5/1994 | Balley . |
| 5,335,722 | 8/1994 | Wu . |
| 5,353,863 | 10/1994 | Yu ........................................... 165/80.3 |
| 5,361,188 | 11/1994 | Kondou et al. ......................... 361/695 |
| 5,368,094 | 11/1994 | Hung . |
| 5,409,352 | 4/1995 | Lin . |
| 5,437,327 | 8/1995 | Chiou . |
| 5,457,342 | 10/1995 | Herbert . |
| 5,502,619 | 3/1996 | Wang . |
| 5,506,752 | 4/1996 | Kong . |
| 5,509,465 | 4/1996 | Lai . |
| 5,535,094 | 7/1996 | Nelson et al. .......................... 361/697 |

FOREIGN PATENT DOCUMENTS

| | | | |
|---|---|---|---|
| 701846 | 1/1965 | Canada .................................. 415/53.1 |
| 3609037 | 10/1986 | Germany ............................... 361/703 |
| 215755 | 12/1984 | Japan .................................... 165/80.3 |
| 226595 | 10/1986 | Japan .................................... 415/53.1 |
| 58900 | 2/1990 | Japan .................................... 361/697 |
| 259673 | 10/1993 | Japan .................................... 361/697 |

*Primary Examiner*—Leonard Leo
*Attorney, Agent, or Firm*—Blakely, Sokoloff, Taylor & Zafmann LLP

[57] ABSTRACT

A cross flow fan cooling device for semiconductor components includes a heat sink and a cross flow fan. The heat sink has a plurality of fins and two mounting slots on two most outside fins. The cross flow fan has a back of fan housing, a fan left end and a fan right end to be assembled into the fan housing. The fan left end has a hole for setting rubber boot which holds a bearing. The bearing is as one side supporter for the blade rotor. A motor is inserted into the fan right end. A shaft of the motor is used as other side supporter for the blade rotor. Both the fan left end and the fan right end have slots, which match slots on the heat sink, for mounting the cross flow fan to the heat sink.

16 Claims, 6 Drawing Sheets

An Exploded View of This Invention

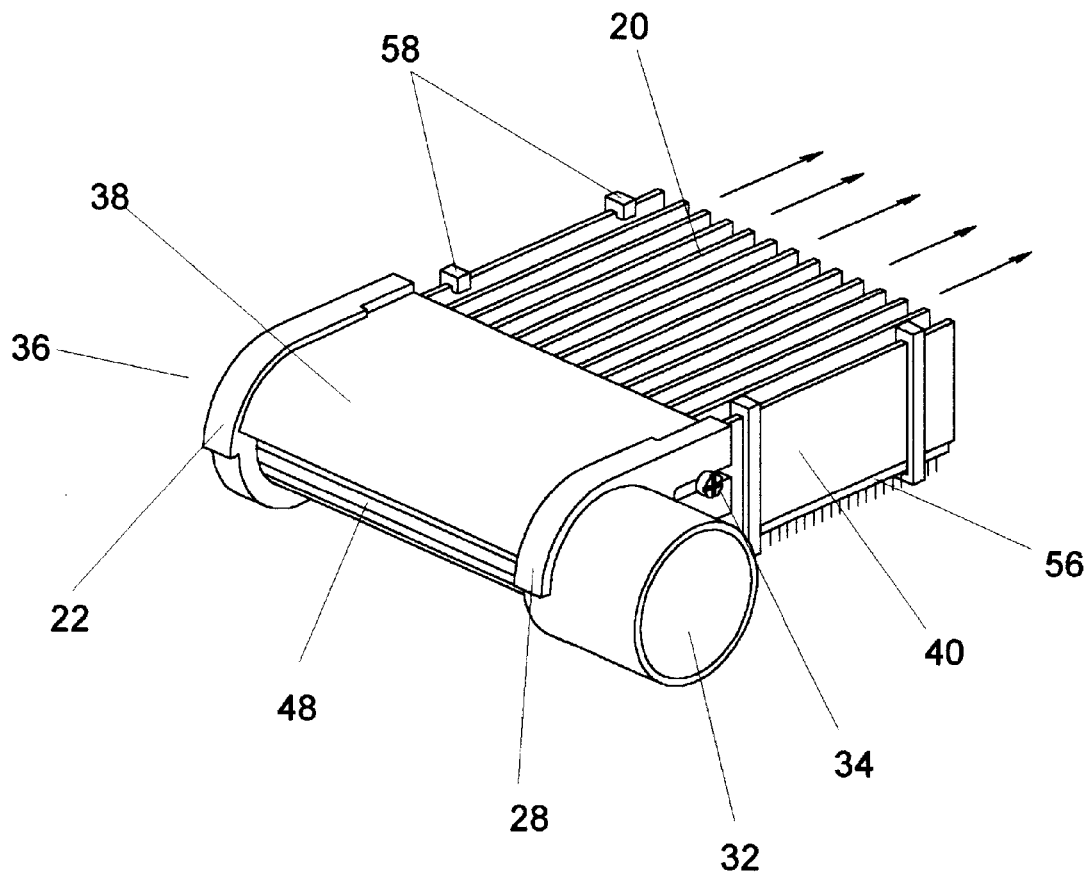
FIG. 4 An Isometric View of This Invention

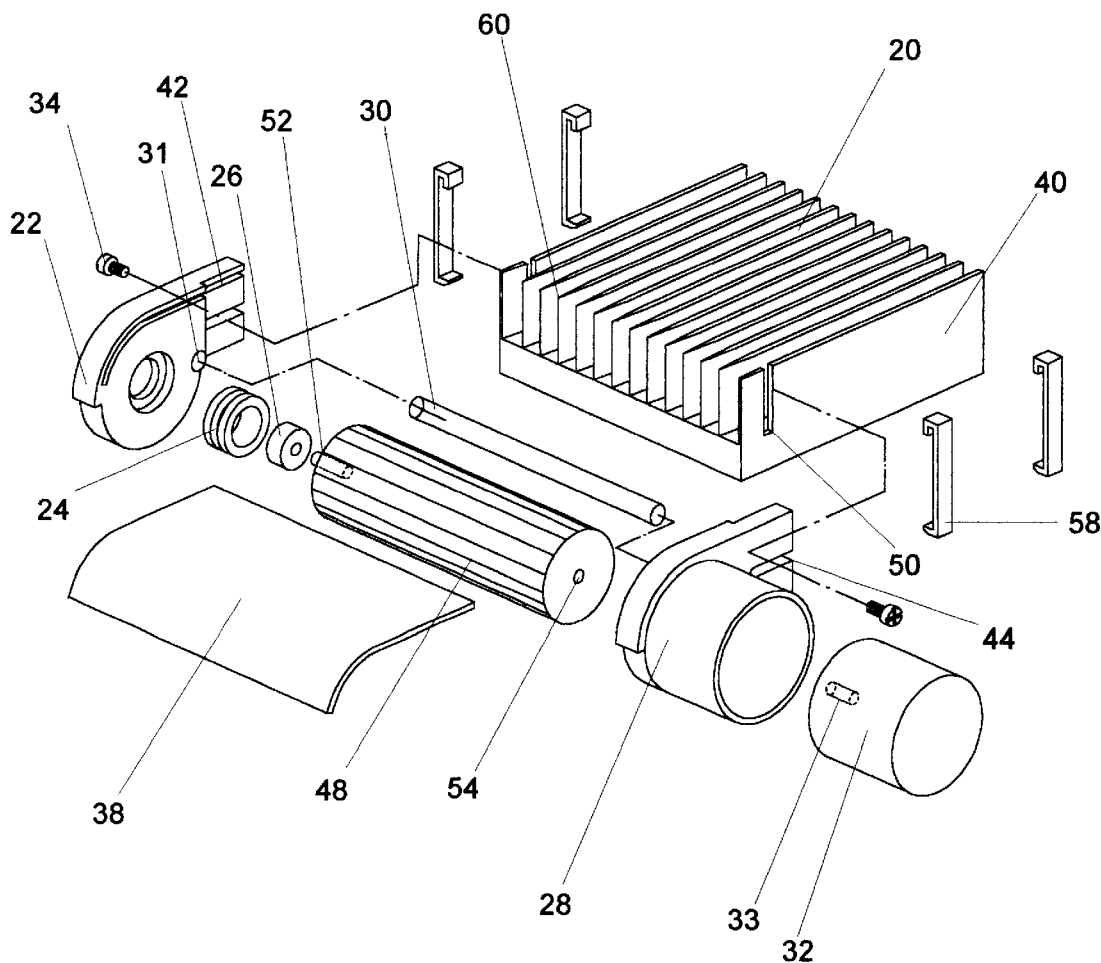
FIG. 5 An Exploded View of This Invention

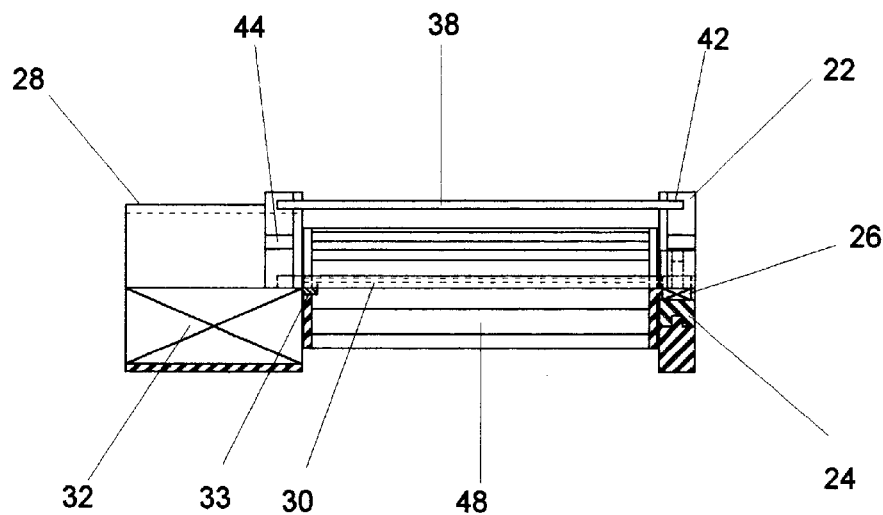
FIG. 6 A Sectional View of This Invention

CROSS FLOW COOLING DEVICE FOR SEMICONDUCTOR COMPONENTS

BACKGROUND

1. Field of Invention

This invention relates generally to a heat dissipating device for cooling semiconductor components which have higher heat dissipation density.

2. Description of the Prior Art

The development of microelectronics or semiconductor industry has brought us CPU, e.g. Pentium, which integrated more than a few millions transistors in one chip. Also, those CPU's plus other IC's can be integrated together into a module called as Multi-Chip Module (MCM). Those CPU or MCM have higher heat dissipation density, which suggests that the heat have to be taken away quickly in certain way, otherwise, reduce the reliability and the life.

For those obvious reasons, a passive cooling structure already on market as shown in FIG. 1. For higher heat dissipating density, a typical active cooling structure is shown in FIG. 2. An axial fan is mounted on the top of a heat sink, the heat sink is mounted in contacted with CPU chip.

Summarized prior arts, there are two major categories to pursuit more efficiency and lower profile fan cooling assembly structure. In the first category, it is to design very slim fan structure with a standard heat sink. Those designs usually lead lower efficiency and Cubic Feet per Minutes (CFM). In second category, it is to design some special heat sinks, which can have a modified axial fan sit into the heat sink. Those designs reduce the dimension in high of cooling assembly as much as the thickness of fan, but sacrifice the conductive heat dissipation of heat sink, since reduce of fin surface area. Same as the first category, it leads lower CFM. In prior arts, there are some controversies among those efforts to reach following three objects at same time: the first is the higher efficiency of air moving away from heat sink; the second is the lower profile of fan and heat sink assembly; the third keeps the higher efficiency of heat sink in both conductive and convective heat transfer. Therefore, all prior arts on cooling CPU have following disadvantages:

(a) All axial fans have hubs, which do nothing with cooling. When set the fan on the top of heat sink to suck or blow air away, the area covered by the hub, almost no air circulation happens there compared with outside of the hub. However, the hub faces often the hottest spot of semiconductor components. The hub contributes nothing of the convective heat transfer.

(b) All axial fans force the air circulation motion in the heat sink in turbulent form, but the heat sink designs do not match the kind of air movement pattern well to maximize the efficiency of convective heat transfer. Inversely, it blocks the air motion, reduces air velocity.

(c) Even many prior arts related to modify the heat sink or the axial fan to reduce the profile of cooling assembly, in any circumstance, anything, such as a plate, can not be set on the top too close to the fan inlet or outlet. Otherwise, no air will get in or out the heat sink. This means that this kind of cooling assembly, an axial fan and a heat sink, have the limitation in some applications, particularly in critical profile limitation.

OBJECTS AND ADVANTAGES

Accordingly, besides those prior art's pursuit objects, several objects and advantages of the present invention are:

(a) to provide an air flow direction parallel to heat sink fin or air movement pattern, which perfectly matches the structure of heat sink. At same time, it increases the cooling efficiency;

(b) to provide a simple combination structure of a cross flow fan and a heat sink which makes it easily mount and change orientation;

(c) to provide a cooling assembly structure which can be used in various slim designs, such as notebook computer and plug-in module board;

(d) to provide a cooling assembly structure which maximize the cooling efficiency in both convective and conductive heat transfer;

(e) to provide a cooling assembly structure which maximizes the compatibility with those standard heat sinks available on the market;

(f) to minimize the profile of the fan heat sink assembly. Still further objects and advantages will become apparent from a consideration of the ensuing description and drawings.

DRAWING FIGURES

FIG. 4 is an isometric view of a cross flow fan cooling device for semiconductor components according to the preferred embodiment of the present invention.

FIG. 5 is an exploded view of the cross flow fan cooling device for semiconductor components shown in FIG. 4.

FIG. 6 is a sectional view of the cross flow fan shown in FIG. 4.

REFERENCE NUMERALS IN DRAWINGS

Figure 1:
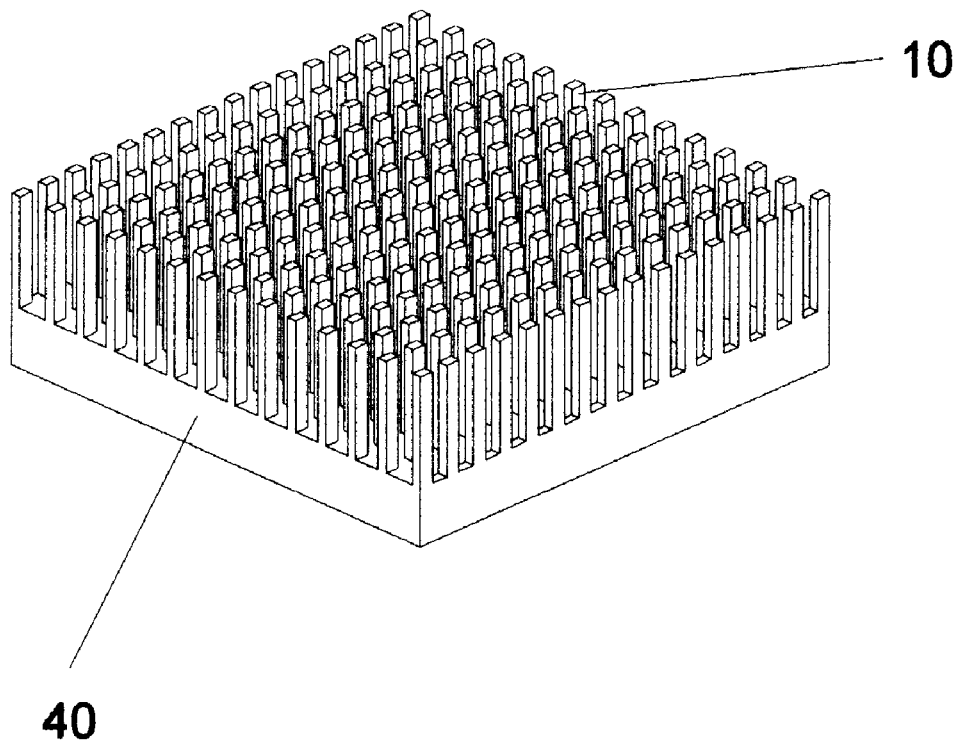
FIG. 1 shows a typical heat sink as a positive cooling device specially designed for cooling CPU or similar semiconductor components.
Figure 2:
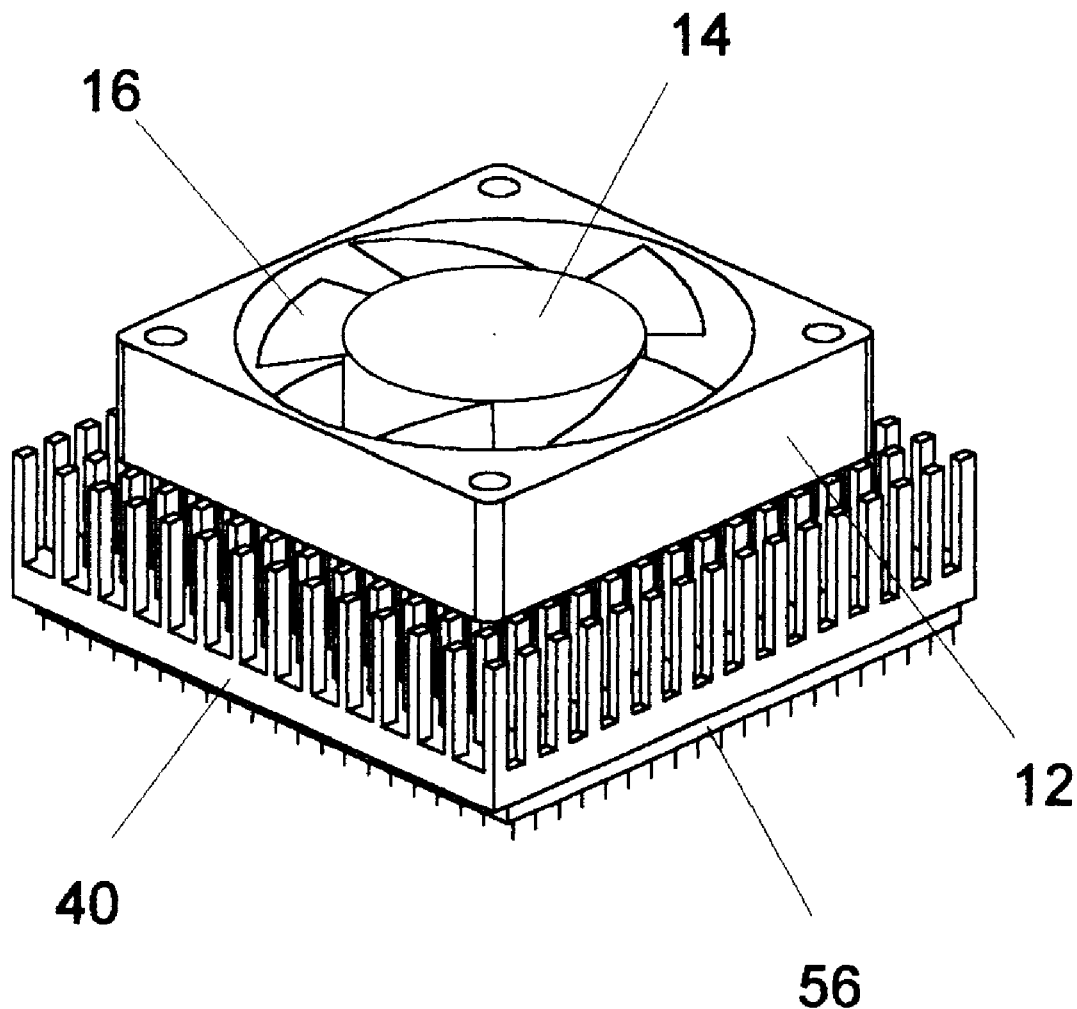
FIG. 2 shows an assembly of a heat sink and an axial fan as an active cooling device, which is most popular style for cooling CPU chip according to the prior arts.
Figure 3:
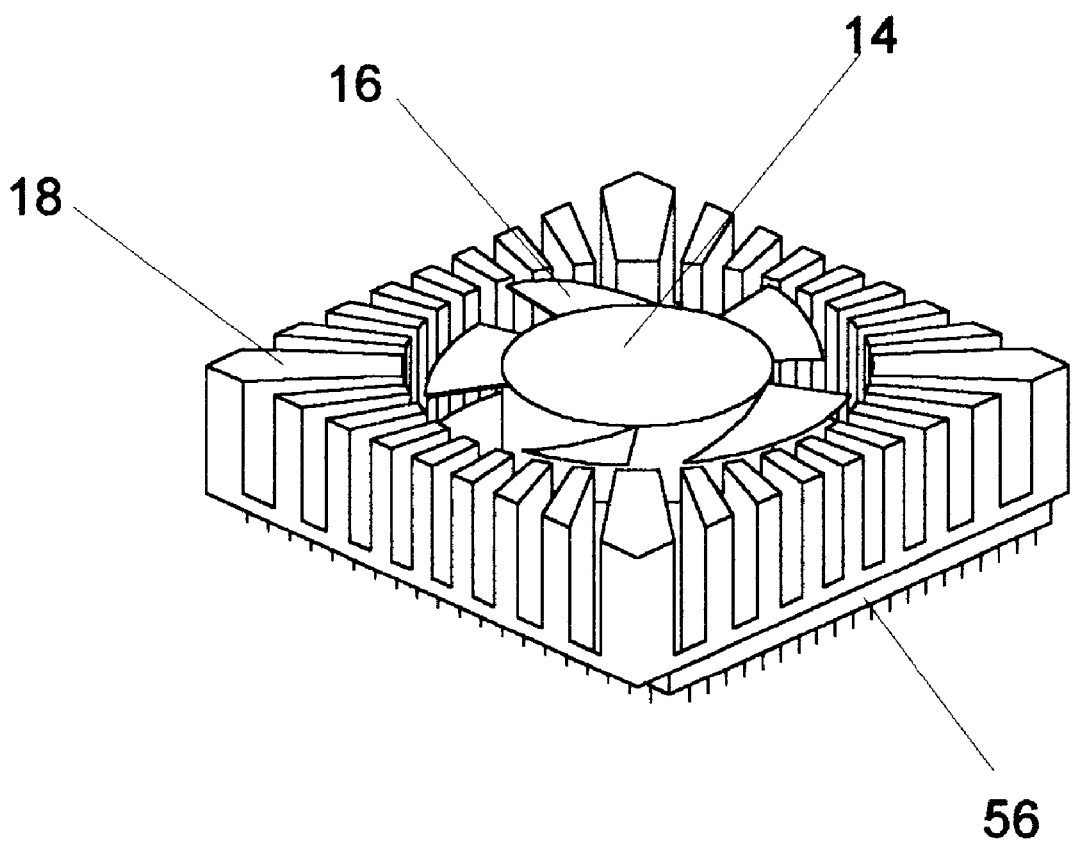
FIG. 3 shows another kind assembly of a heat sink and an axial fan as an active cooling device. The heat sink and the axial fan are specially designed to obtain a lower profile.

10 Pin Fin 12 Axial Fan
14 Fan Hub 16 Fan Blade
18 Radiating Fin 20 Plate Fin
22 Fan Left End 24 Rubber Boot
26 Bearing 28 Fan Right End
30 Cut Off Rod 31 Mounting Hole
34 Motor 33 Motor Shaft
34 Mounting Screw 36 Cross Flow Fan
38 Back of Fan Housing 40 Heat Sink
42 Mounting Slot for Back of Fan Housing 44 Mounting Slot on Cross Flow Fan
46 Fan Air Outlet 48 Blade Rotor
50 Mounting Slot on Heat Sink 52 Blade Rotor Shaft
54 Blade Rotor Hole 56 CPU
58 Mounting Clamps 60 Sharper Edge of Plate Fin

DESCRIPTION OF THE PREFERRED EMBODIMENT

Described herein is a cross flow fan cooling device for semiconductor components. In one embodiment, the present invention provides a device including the cross flow fan and a heat sink for cooling a semiconductor component. The semiconductor component may be a central processing unit ("CPU") or a multi-chip module ("MCM"). The heat sink has one surface physically mounted to a surface of the semiconductor component for dissipating heat from the semiconductor component. The cross flow fan creates directional air flow that flows in parallel to a surface to be cooled and that flows away from the cross flow fan.

FIG. 4 illustrates a cross flow fan cooling device for semiconductor components in accordance with the present invention. The cross flow fan cooling device generally includes a heat sink 40 and a cross flow fan 36. The cross flow fan 36 is mounted to one side of the heat sink 40.

FIGS. 5 and 6 illustrate the cross flow fan 36 in more detail. The cross flow fan 36 comprises a fan left end 22 and a fan right end 28. The fan left end 22 has a hole for holding a rubber boot 24. A bearing 26 that is used for holding one end of a blade rotor 48 sits inside the rubber boot 24. The fan right end 28 has a compartment for housing a motor 32. The cross flow fan 36 further comprises a blade rotor 48, a cut off bar 30 and a back of fan housing 38. One side of the blade rotor 48 has a blade rotor shaft 52 and the diameter of the blade rotor shaft 52 matches the diameter of the bearing 26. The other side of the blade rotor 48 has a blade rotor hole 54 for adopting a motor shaft 33. The fan left end 22 and the fan right end 28 further include mounting slots 42 and mounting holes 31. The mounting slots 42 are designed to match the section size of the back of fan housing 38 for mounting the back of fan housing 38 to the cross flow fan 36. Diameters of the mounting holes 31 match the diameter of the cut off rod 30 for mounting the cut off rod 30 to the cross flow fan 36. The cross flow fan cooling device further includes four mounting clamps 58 for assembling the cross flow fan cooling device to a CPU or a MCM.

FIG. 5 further illustrates the heat sink 40 having a plurality of plate fins 20. One side of the plate fins 20 contains sharper edge to facilitate air flow. The heat sink 40 further includes two mounting slots 50 on two side plate fins for mounting the cross flow fan 36 to the heat sink 40.

In a preferred embodiment, a cross flow fan cooling device containing the heat sink 40 and the cross flow fan 36 is mounted to a semiconductor component or CPU 56, where the cross flaw fan 36 supplies a directional air flow in parallel to a surface of the semiconductor component to be cooled. The cross flaw fan 36 further contains an air outlet and the cut off rod 30. The air outlet is configured to match one side of the heat sink 40 for guiding air flow through surface of the heat sink 40. The cut off rod 30 performs a function to guide air flow in a direction parallel to the surface of the semiconductor component to be cooled. The sharper edges of plate fins 60 are designed to maximize air flow through the heat sink 40. The rubber boot 24 is configured to minimize potential vibration, which may be caused by operation of the blade rotor 48.

In the foregoing detailed description, the cross flow fan cooling device of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

SUMMARY OF INVENTION

The present invention have a cross flow fan and a heat sink. The main different from prior arts is that using the cross flow fan obtains a parallel air movement direction relative to heat sink. The air movement direction perfectly matches the heat sink structure to maximize the efficiency of convective heat transfer. Furthermore, the cooling device for semiconductor components has the additional advantages in that:

it provides a simple combination structure of a cross flow fan and a heat sink which make it easily mount and change orientation;

it provides a cooling assembly structure which can be used in various slim designs, such as notebook computer and plug-in module board;

it provides a cooling assembly structure which maximize the cooling efficiency in both convective and conductive heat transfer;

it provides a cooling assembly structure which maximize the compatibility with those standard heat sinks available on the market;

it minimizes the profile of the fan heat sink assembly.

Although the description above contains many specificities, these merely providing illustrations of some of the presently preferred embodiments of this invention. For example, the heat sink can have other shape fins, such as pin fin and spine fin; both the heat sink and the cross flow fan can be made large and longer enough to match larger size of CPU or MCM; different mounting clamps can be used to assemble the cross flow fan cooling device to chips to be cooled etc.

Thus the scope of the invention should be determined by the appended claims and their legal equivalents, rather than by the examples given.

I claim:

1. A low profile cross flow fan cooling device comprising:

a) a heat sink including a plurality of fins having a first side mountable to a surface of a semiconductor component for dissipating heat from said semiconductor component; and b) a cross flow fan mounted to a second side of said heat sink, said second side being substantially perpendicular to said first side of said heat sink, a vertical dimension of the heat sink in combination with the semiconductor component being substantially similar to a vertical dimension of the cross flow fan, the heat sink further including vertical mounting slots located on outermost fins for attaching the cross flow fan to the heat sink, said cross flow fan for creating air flow across a substantially round cut off rod in parallel to said surface of said semiconductor component to be cooled off, said air flow being guided away from said cross flow fan.

2. The cross flow fan cooling device of claim 1, wherein said cross flow fan further comprises a blade rotor configured to create said air flow in parallel to said surface of said semiconductor component to be cooled.

3. The cross flow fan cooling device of claim 2, wherein said blade rotor contains a plurality of blades, longitudinal direction of said blades oriented in a direction perpendicular to longitudinal direction of said fins of said heat sink.

4. The cross flow fan cooling device of claim 3 further comprising a rubber boot configured to reduce vibration associated with operation of said blade rotor.

5. The cross flow fan cooling device of claim 3 further comprising an air outlet positioned to said second side of said heat sink, said air outlet configured to guide air flow in parallel to said surface of said semiconductor component to be cooled.

6. The cross flow fan cooling device of claim 3, wherein said cross flow fan further comprises left and right ends for mounting said blade rotor.

7. The cross flow fan cooling device of claim 1, wherein said fins are configured to dissipate heat from said semiconductor component.

8. The cross flow fan cooling device of claim 1 further comprising mounting clamps for mounting said cooling device to said semiconductor component.

9. A system comprising:

a semiconductor component; and a cooling device coupled to said semiconductor component configured to dissipate heat from said semiconductor component, said cooling device comprising:

a) a heat sink including a plurality of fins having a first side mountable to a surface of said semiconductor component for dissipating heat from said semiconductor component; and b) a cross flow fan mounted to a second side of said heat sink, said second side being substantially perpendicular to said first side of said heat sink, a vertical dimension of the heat sink in combination with the semiconductor component being substantially similar to a vertical dimension of the cross flow fan, the heat sink further including vertical mounting slots located on outermost fins for attaching the cross flow fan to the heat sink, said cross flow fan for creating air flow across a substantially round cut off rod in parallel to said surface of said semiconductor component to be cooled off, said air flow being guided away from said cross flow fan.

10. The system of claim 9, wherein said semiconductor component may be a central processing unit ("CPU") or a multi-chip module ("MCM").

11. The device of claim 9, wherein said cross flow fan comprises a blade rotor configured to create said air flow in parallel to said surface of said semiconductor component to be cooled.

12. The device of claim 11, wherein said blade rotor contains a plurality of blades oriented in a direction perpendicular to a longitudinal direction of said fins of said heat sink.

13. The device of claim 11 further comprising a rubber boot configured to reduce vibration associated with operation of said blade rotor.

14. The device of claim 11 further comprising an air outlet positioned to said second side of said heat sink, said air outlet configured to guide air flow in parallel to said surface of said semiconductor component to be cooled.

15. The device of claim 11, wherein said cross flow fan further comprises left and right ends for mounting said blade rotor.

16. The device of claim 11, wherein said fins are configured to dissipate heat from said semiconductor components.

* * * * *

UNITED STATES PATENT AND TRADEMARK OFFICE
CERTIFICATE OF CORRECTION

PATENT NO. : 6,047,765
DATED : April 11, 2000
INVENTOR(S) : Zhang et al.

It is certified that error appears in the above-identified patent and that said Letters Patent is hereby corrected as shown below:

On the title page item [76], delete "Xiao Zhan" and insert --Xiao Zhang--.

Signed and Sealed this

Thirtieth Day of January, 2001

Attest:

Q. TODD DICKINSON

*Attesting Officer*     *Director of Patents and Trademarks*